US010199989B2

(12) United States Patent
Seth et al.

(10) Patent No.: US 10,199,989 B2
(45) Date of Patent: Feb. 5, 2019

(54) LOW VOLTAGE FEEDFORWARD CURRENT ASSIST ETHERNET LINE DRIVER

(71) Applicant: Texas Instruments Incorporated, Dallas, TX (US)

(72) Inventors: Sumantra Seth, Bangalore (IN); Ashwin Ramachandran, Corvallis, OR (US); Gururaj Ghorpade, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 488 days.

(21) Appl. No.: 14/850,531

(22) Filed: Sep. 10, 2015

(65) Prior Publication Data

US 2016/0072735 A1    Mar. 10, 2016

Related U.S. Application Data

(60) Provisional application No. 62/048,406, filed on Sep. 10, 2014.

(51) Int. Cl.
*H03F 1/02* (2006.01)
*H03F 3/30* (2006.01)
(Continued)

(52) U.S. Cl.
CPC .......... *H03F 1/0277* (2013.01); *H03F 3/30* (2013.01); *H03F 3/3032* (2013.01);
(Continued)

(58) Field of Classification Search
CPC . H03F 1/0277; H03F 3/72; H03F 3/30; H03F 3/3032; H03F 2200/513;
(Continued)

(56) References Cited

U.S. PATENT DOCUMENTS 4,835,489 A * 5/1989 Monticelli ............. H03F 1/083
330/151
7,295,071 B1 * 11/2007 Lee ..................... H03F 3/45188
330/258

(Continued)

OTHER PUBLICATIONS

AN-1469 PHYTER Design & Layout Guide, Texas Instruments, Application Report, SNLA079D, Oct. 2006, Revised Apr. 2013, 16 pgs.

(Continued)

*Primary Examiner* — Marsha D Banks Harold
*Assistant Examiner* — Dharmesh J Patel
(74) *Attorney, Agent, or Firm* — Tuenlap Chan; Charles A. Brill; Frank D. Cimino

(57) ABSTRACT

Described examples include Ethernet physical layer (PHY) interface integrated circuits with transmit interface circuitry for transmitting data to an Ethernet network through a magnetic interface, which includes a voltage mode first amplifier with an output that generates a first voltage signal from a supply voltage according to a data input signal. The transmit interface circuit also includes a feedforward second amplifier circuit with an output stage that operates in a first mode to generate a current signal from the supply voltage according to the first voltage signal and to provide the current signal to the first amplifier output to boost a peak voltage at the output above the supply voltage to facilitate support for higher peak signal voltage swings for 10Base-T applications while using 2.5 volt or other low voltage supply levels.

23 Claims, 4 Drawing Sheets

(51) Int. Cl.
*H03F 3/45* (2006.01)
*H03F 3/72* (2006.01)

(52) U.S. Cl.
CPC .......... *H03F 3/45475* (2013.01); *H03F 3/72* (2013.01); *H03F 2200/513* (2013.01); *H03F 2203/45116* (2013.01); *H03F 2203/45526* (2013.01)

(58) Field of Classification Search
CPC ....... H03F 3/45475; H03F 2203/45526; H03F 2203/45116; H03F 2200/144; H03F 3/45076; H04L 49/40; H04L 49/352
See application file for complete search history.

(56) References Cited

U.S. PATENT DOCUMENTS

| | | |
|---|---|---|
| 2007/0134986 A1 | 6/2007 | Hemmah |
| 2011/0194408 A1 | 8/2011 | Shalita et al. |
| 2011/0243206 A1 | 10/2011 | Shalita et al. |
| 2013/0156079 A1* | 6/2013 | Shih .................... H03F 3/45 375/221 |
| 2013/0219195 A1 | 8/2013 | Picard |
| 2014/0139198 A1* | 5/2014 | Manlove ............... H02M 3/156 323/282 |
| 2015/0035365 A1 | 2/2015 | Picard et al. |
| 2015/0042243 A1 | 2/2015 | Picard |

OTHER PUBLICATIONS

AN-1540 Power Measurement of Ethernet Physical Layer Products, Texas Instruments, Application Report, SNLA089B, Nov. 2006, REvixed Apr. 2013, 9 pgs.

DP83867IR Robust, High Immunity 10/100/1000 Ethernet Physical Layer Transceiver, Texas Instruments, SNLS484A, Feb. 2015, Revised Jun. 2015, 7 pgs.

* cited by examiner

LOW VOLTAGE FEEDFORWARD CURRENT ASSIST ETHERNET LINE DRIVER

REFERENCE TO RELATED APPLICATION

Under 35 U.S.C. § 119(e), this application claims priority to, and the benefit of, U.S. provisional patent application Ser. No. 62/048,406, entitled "A LOW VOLTAGE FEEDFORWARD CURRENT ASSIST (FCA) ETHERNET LINE DRIVER", and filed on Sep. 10, 2014, the entirety of which is hereby incorporated by reference.

TECHNICAL FIELD

The present disclosure relates to network interface circuits, and more particularly to low voltage Ethernet line drivers.

BACKGROUND

Network interfaces allow connection of a variety of devices to one another through a network, with individual devices including a network interface controller or network interface card (NIC) providing a physical layer (PHY) interface to transmit and receive signals to or from the network. Modern Ethernet networks provide interconnection using twisted pair wiring with magnetic coupling according to various standards. FIG. 4 shows the magnetic coupling for an Ethernet network interface, in which a driver 400 transmits data to a primary winding 406 of a transformer 410. The transformer has a secondary winding 408 connected through an RJ-45 connector to a load resistance RL representing the Ethernet network impedance. The transmit driver 400 is presented with series impedances Rt 402a and 402b, where RT=RL/2 for a 1:1 transformer turns ratio. The most popular line driver for Ethernet is based on a current mode. For a current mode transmit driver 400, a center tap CT of the primary winding 406 is driven by a voltage source (not shown). As seen in FIG. 5, a current mode driver 500 includes a current source 502 driving a load 504b ($R_{LOAD}$). However, current mode drivers suffer from low efficiency since half the current is wasted in the internal resistance 504a ($R_{INT}$). In addition, current mode line drivers often require digital wave shaping (e.g., at higher frequency above 500 MHz) to meet harmonic distortion requirements in different modes. FIG. 6 shows a voltage mode driver 600 with a voltage source 602 and an internal resistance 6046a ($R_{INT}$) to drive a load 606 ($R_{LOAD}$). Although voltage mode drivers offer better efficiency than current mode drivers do, the required peak voltage swings are different for different Ethernet modes. Some examples of Ethernet standards or modes are 10Base-Te (energy efficient), 100Base-T and 1000Base-T. A table 412 in FIG. 4 shows peak differential voltage swing amounts for the output voltage Vo across the network load resistance RL for three different modes 1000Base-Te, 100Base-T, and 10Base-Te. For a voltage mode driver, the differential peak swing at the output Vol of the voltage driver 400 doubles the required load swing Vo, assuming RT=RL/2. Thus, a 3.6 volt supply voltage is needed for a true voltage mode driver in 10Base-Te mode. In contrast, 1000Base-T or 100Base-T mode requires 1V differential peak swing, and voltage mode drivers 400 can be powered by a 2V supply for these modes. For a voltage mode driver to work across these three modes, a minimum 3.6V supply is required, but this leads to excess power consumption for 1000Base-T mode operation. Thus, conventional current mode drivers 500 and voltage mode drivers 600 do not provide low power solutions for supporting a three 1000Base-Te, 100Base-T, and 10Base-Te Ethernet modes and these conventional driver architectures do not allow operation from a low voltage battery or other low voltage supply.

SUMMARY

Disclosed examples include low power network interface circuits with hybrid drivers for low voltage interfacing to Ethernet networks. Unlike existing line driver architectures, disclosed examples can be selectively employed to drive 10/100/1000Base-T Ethernet signals using a 2.5V supply voltage, while accommodating the higher peak voltage swings for energy efficient 10Base-Te mode operation. Disclosed network interface examples include a voltage mode first amplifier circuit to provide a first amplifier output signal, and a second amplifier with an output circuit operative in a first mode to selectively provide a feedforward current output signal to increase the voltage swing at the first amplifier output. The added current in the first mode facilitates efficient voltage mode support for 10Base-Te operation using a 2.5V supply voltage. In a second mode, the second amplifier output circuit refrains from providing the feedforward current output signal to the first amplifier output to provide low power 1000Base-T or 100Base-T operation. In some examples, the second amplifier circuit includes a unity gain amplifier with a current mirror output stage to selectively provide the feedforward current output independent of the first amplifier feedback circuit. The first and second amplifiers are differential in certain examples.

DETAILED DESCRIPTION

Figure 1:
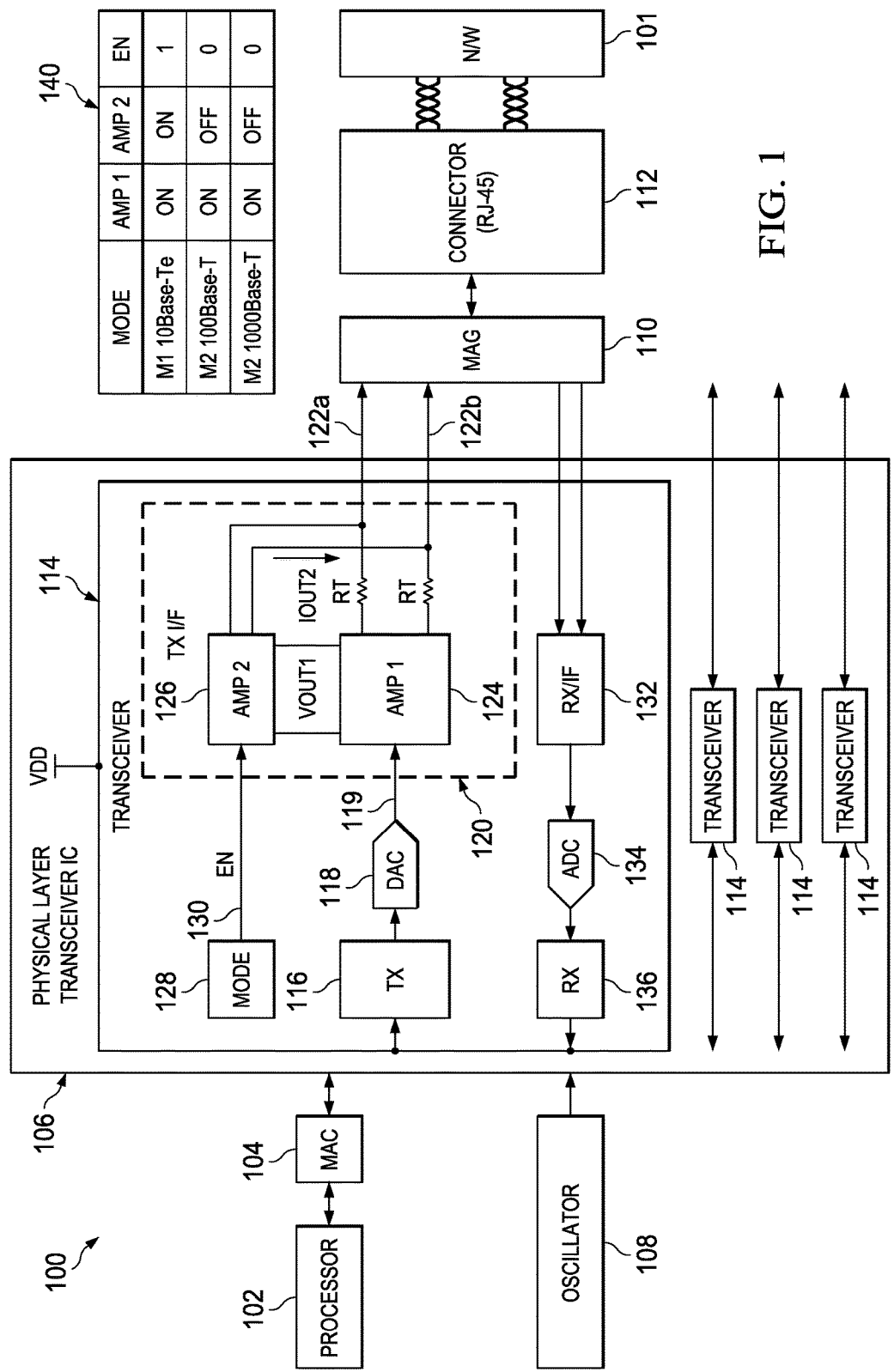
FIG. 1 is a schematic diagram of a host system with an Ethernet physical layer transceiver integrated circuit.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

FIG. 1 shows a host system 100 that includes a host processor 102, a media access control (MAC) interface circuit 104, and an Ethernet physical layer (PHY) transceiver integrated circuit (IC) 106 operating for transmit and receive operations according to a clock signal from an oscillator 108. The PHY transceiver 106 interfaces the host system 100 with a network 101 through a magnetic interface 110, a connector 112 and twisted pair wiring for sending and receiving transmit and receive data to and from the network 101. The network 101 in one example is an Ethernet network, and the system 100 exchanges data with one or more other devices (not shown) through full-duplex communications via the network 101. The host processor 102 and the MAC circuit 104 provide a media independent interface that exchanges data with the network 101 through a transceiver circuit 114 of the PHY IC 106. In particular, the transceiver circuit 114 sends transmit (TX) data to the network 101 according to outgoing data received from the media independent interface 102, 104. In one example, the transceiver IC 106 includes more than one transceiver circuit 114, for example, four transceiver circuits 114 as shown in FIG. 1. The transceiver provides receive (RX) data to the media independent interface 102, 104 according to incoming data received from the network 101. In one example, the individual twisted pairs are category 5 or CAT5 cables forming half-duplex 1000/100/10Base-T connections with a standard RJ-45 connector 112 and magnetic interface circuitry 110 to transfer incoming and outgoing data.

The transceiver circuit 114 of the PHY IC 106 includes interface circuits 120 and 132 along with data path circuits 116 and 136, and digital/analog interface circuits 118 and 136. For outgoing data, the transceiver circuit 114 includes a transmit (TX) data path circuit 116 receiving outgoing data from the MAC circuit 104. The TX data path circuit 116 provides the outgoing data to a digital to analog converter (DAC) 118 for transmission by a transmit interface circuit 120. Incoming data is received from the magnetic circuit 110 by a receive (RX) interface circuit 132. The received data is converted to digital form by an analog to digital converter (ADC) circuit 134 and the digital data is provided to the MAC circuit 136 by a receive data path circuit 136. The transmit interface circuit 120 operates from a power supply voltage VDD, in one example, a 2.5V supply.

The transmit interface circuit 120 includes a first amplifier circuit 124 (AMP1 in FIG. 1) with a first amplifier input 119 that receives a first amplifier input signal from the DAC 118 representing the outgoing or transmit data. In one example, the first amplifier circuit 124 is a class AB amplifier including a voltage mode driver circuit to generate a first amplifier output as a voltage signal VOUT1 from the supply voltage VDD according to the outgoing data input signal from the DAC 118. The transmit interface circuit 120 also includes a second amplifier circuit 126 (AMP2 in FIG. 1). In one example, the second amplifier circuit 126 is a class AB amplifier including a second amplifier input to receive the first amplifier output signal VOUT1. The second amplifier circuit 126 is selectively enabled by a mode control signal EN to provide a feedforward current output signal IOUT2 to the first amplifier output in a first mode. The second amplifier 126 also operates from the supply voltage VDD, and thus the transceiver circuit 114 can be powered from a low voltage supply level, such as VDD=2.5V in one example, while supporting the output voltage swing requirements of the 10Base-Te mode.

The feedforward current assist provided by the selective addition of the output signal IOUT2 to the first amplifier output in the first mode allows the higher voltage swings (e.g., 3.6 volts peak to peak) to support 10Base-Te. The mode control circuit 128 disables the current output IOUT2 in the second mode M2 for 1000Base-T or 100Base-T operation. As seen in the table 140 of FIG. 1, the first amplifier circuit 124 is ON or enabled during the first and second modes M1 and M2. The second amplifier circuit 126 is enabled to provide the output signal IOUT2 in the first mode, but refrains from providing the feedforward current output signal IOUT2 to the first amplifier output in the second mode M2. In this manner, the hybrid transmit interface circuit 120 provides a voltage mode driver 124 to support 1000Base-T or 100Base-T in the second mode M2 while avoiding the inefficiencies of current mode drivers, and the second amplifier circuit 126 provides additional or enhanced output voltage capabilities to support 10Base-Te operation in the first mode M1.

Figure 2:
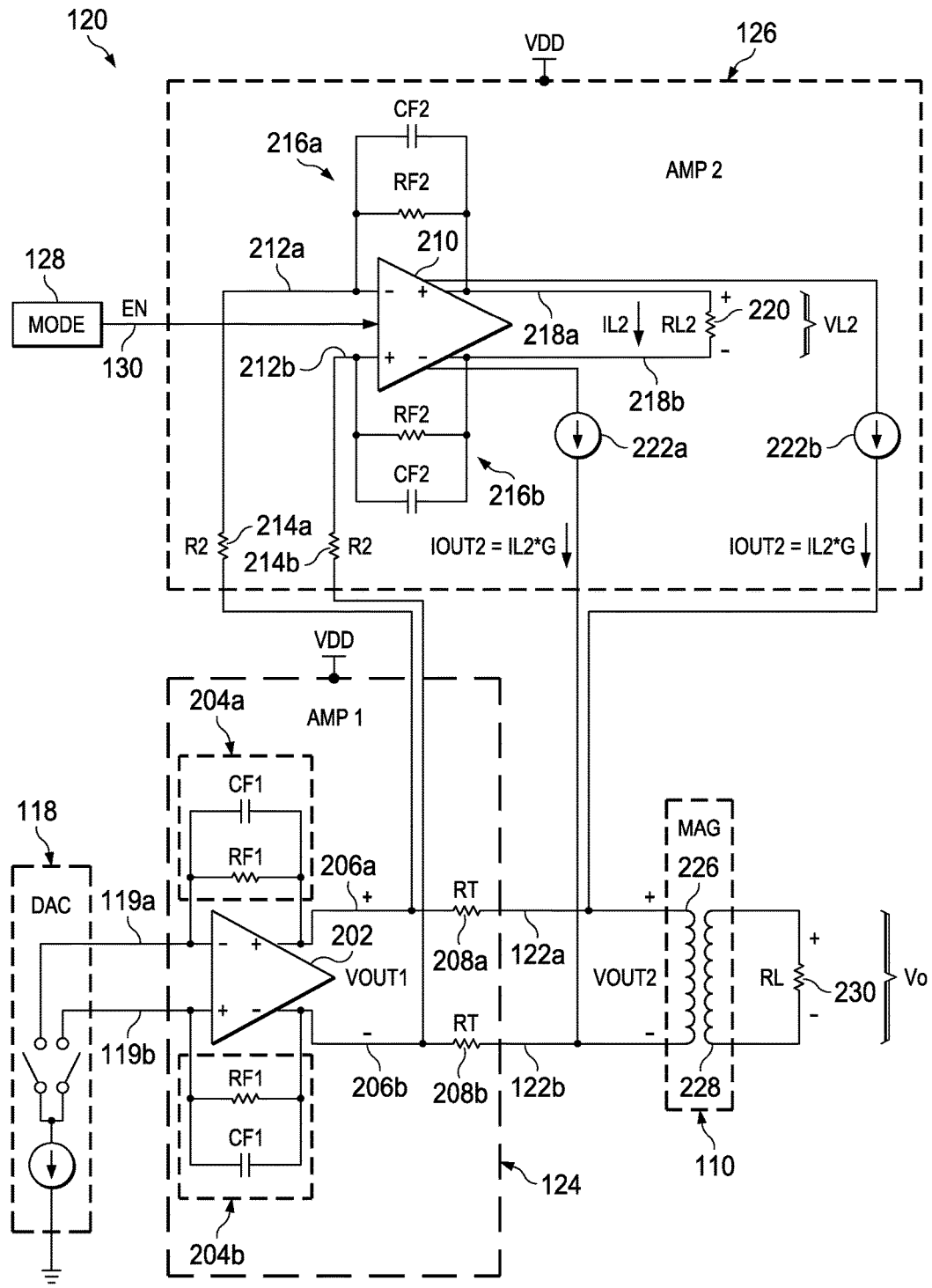
FIG. 2 is a schematic diagram of a transmit interface circuit in the physical layer transceiver IC of FIG. 1.
Figure 3:
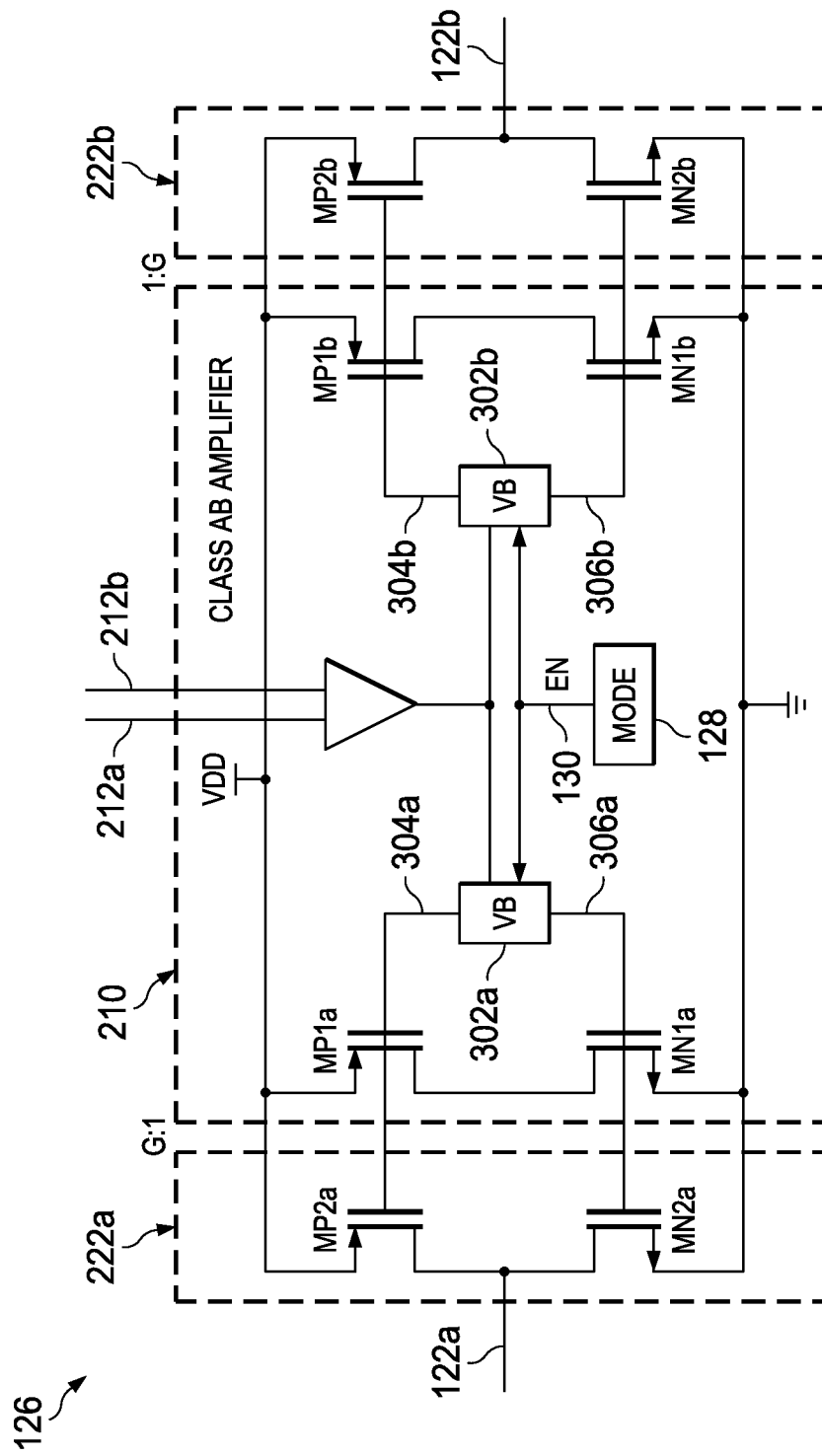
FIG. 3 is a schematic diagram of a class AB second amplifier in the transmit interface circuit of FIG. 2.
Figure 4:
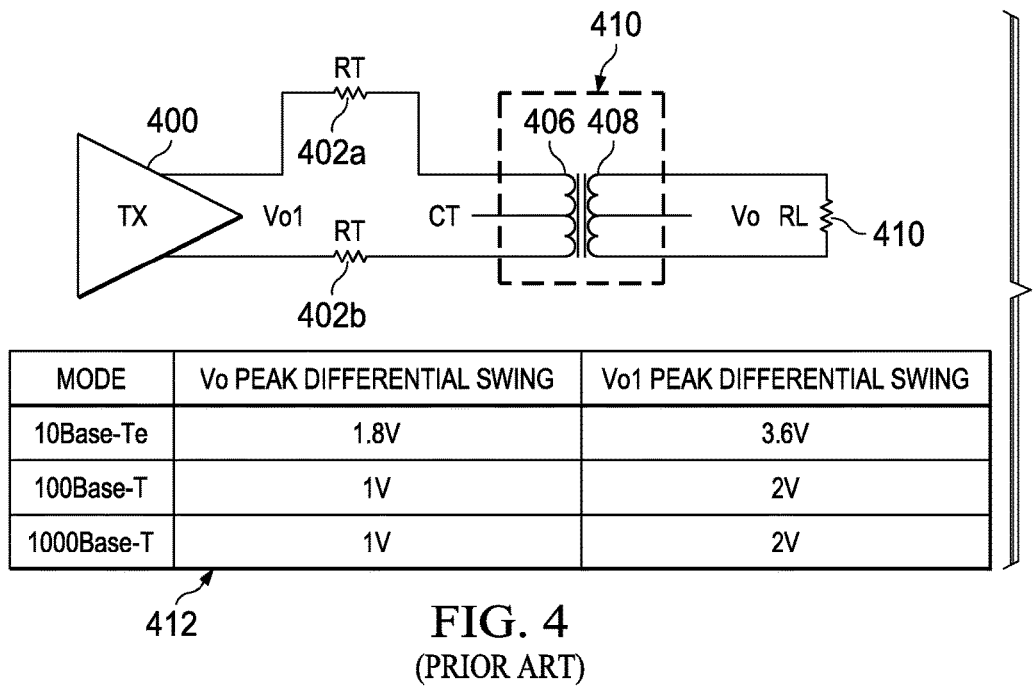
FIG. 4 is a schematic diagram of an Ethernet transmit circuit.
Figure 5:
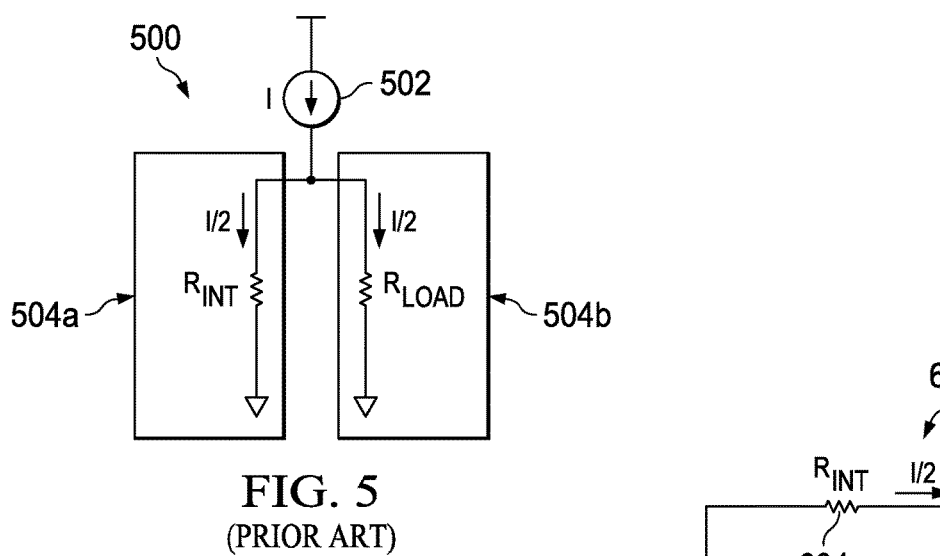
FIG. 5 is a schematic diagram of a current mode driver transmit circuit.
Figure 6:
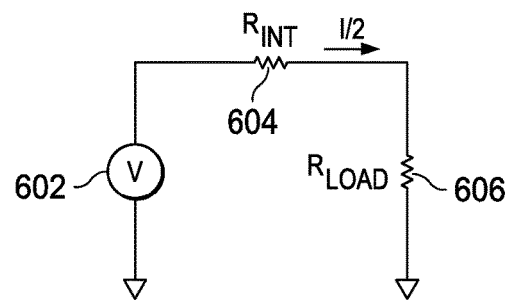
FIG. 6 is a schematic diagram of a voltage mode driver transmit circuit.

Referring now to FIGS. 2 and 3, FIG. 2 shows further details of one example of the transmit interface circuit 120, and FIG. 3 shows an example class AB second amplifier circuit 126 in the transmit interface circuit 120 of FIG. 2. In these examples, the first amplifier circuit 124 includes a differential current to voltage (V to I) amplifier circuit 202 receiving a differential data input signal. The amplifier circuit 202 provides a differential voltage output signal VOUT1 to drive a transformer primary winding 226. The second amplifier circuit 126 includes a differential transconductance amplifier circuit 210 with a differential current mirror circuit output stage 222. In other examples, single ended first and second amplifiers 124 and 126 can be used. The DAC 118 in FIG. 2 includes a switching circuit and a current source to provide the outgoing data as a differential current signal to first and second differential first amplifier input terminals or nodes 119a and 119b. The amplifier 202 includes a first output 206a and a second output 206b to provide the first amplifier output signal VOUT1 as a differential voltage to drive a primary winding 226 of the magnetic interface circuit transformer 110. The output circuit of the first amplifier 124 includes termination resistances 208a and 208b (RT). The first amplifier output voltage signal VOUT1 creates a primary voltage VOUT2 to drive the output load voltage Vo across a load 230 (RL in FIG. 2) using a secondary winding 228.

A first feedback circuit 204a includes a parallel combination of a feedback resistor RF1 and a feedback capacitor CF1 coupled between the first input 119a and the first output 206a. A second feedback circuit 204b includes a resistor RF1 and a capacitor CF1 coupled between the second input 119b and the second output 206b of the differential amplifier 202. The first amplifier circuit 124 operates in the first mode M1 and the second mode M2 as a voltage mode driver circuit in which the output 206 generates the first voltage signal VOUT1 from the supply voltage VDD according to the data input signal from the DAC 118.

The second (feedforward) amplifier circuit 126 in this example includes an output stage 222 shown as differential first and second current sources 222a and 222b. The output stage generates a differential current signal IOUT2 from the supply voltage VDD according to the first voltage signal VOUT1. The current signal IOUT2 is provided to the first amplifier output 206 at nodes 122a and 122b between the termination resistors 208 (RT) and the transformer primary winding 226 to selectively boost a peak voltage at the output 206 above the supply voltage VDD based on MODE control (128). In one example, as shown in FIG. 3 below, the mode control circuit 128 selectively enables the current sources 222a and 222b for operation in the first mode M1 or disables the current sources 222a and 222b in the second mode M2 according to the control signal EN.

In the example of FIG. 2, the second amplifier circuit 126 includes a differential transconductance amplifier 210 with differential second amplifier inputs 212a and 212b coupled through resistors 214a and 214b (R2) with the first amplifier outputs 206a and 206b, respectively, to receive the differential first amplifier output signal VOUT1. The transconductance amplifier 210 controls the current sources 222 to provide a second amplifier output circuit 222a, 222b coupled with the first amplifier output through the terminal resistors 208 at the nodes 206a and 206b. In the first mode, the second amplifier output circuits 222a and 222b provide the differential feedforward current output signal IOUT2 to the first amplifier output according to the first amplifier output signal VOUT1 and a gain value G. This creates additional voltage output swing at the primary 122a, 122b of the magnetic 110 (resulting higher voltage swing across RL 230 on the secondary side of the magnetic) in the first mode to implement 10Base-Te operation using a supply voltage VDD less than the required voltage swing. In the second mode, the second amplifier output circuit 222a, 222b refrains from providing the feedforward current output signal IOUT2 to the first amplifier output 206a, 206b by either disconnecting the output circuit 222 from the nodes 122 or by disabling the current sources 222 in certain examples.

The differential amplifier 210 in this example provides a differential current output signal IL2 at outputs 218a and 218b to provide a load voltage signal VL2 across a load resistor 220 (RL2) according to the first amplifier output signal VOUT1. A differential feedback circuit 216a and 216b includes second feedback resistors RF2 and capacitors CF2 individually coupled between the differential amplifier outputs 218a, 218b and the second amplifier inputs 212a, 212b to set a gain of the differential amplifier 210. The capacitors CF2 can be omitted in certain examples. In the illustrated example, the gain of the closed loop AMP2 circuit 210 is unity. In this manner, the second amplifier circuit 126 generates the load voltage signal VL2 across the load resistor RL2 at least partially according to the first amplifier output signal VOUT1. Moreover, the second amplifier circuit 126 presents no additional loading to the DAC 118, and provides the feedforward current output signal IOUT2 independent of the first and second feedback circuits 204 of the first amplifier circuit 124.

FIG. 3 shows one example of the second amplifier circuit 126 in which the output stage 222 includes a current mirror circuit 222 that generates the current signals IOUT2 according to signal voltage VL2 generated by a transconductance amplifier 210 and a feedforward gain value G. The feedforward current signal IOUT2 in this example is IL2*G. The gain G is set by the relative sizing of the output stage transistors 208. In one example, the feedforward gain value G is greater than 1. In response to the control signal EN setting the mode of the transceiver circuit 114 to the second mode M2, the second amplifier circuit 126 in one example disables the current mirror circuit 222a, 222b to prevent the second amplifier circuit 126 from providing the feedforward current output signal IOUT2 to the first amplifier output 206a, 206b.

As seen in FIG. 3, the differential current mirror circuit 222 in one example includes first PMOS transistors MP1a and MP1b as well as first NMOS transistors MN1a and MN1b coupled to the supply voltage VDD as part of an output stage of the class AB amplifier including the differential amplifier 210. The differential output of the transconductance amplifier 210 couples through a bias circuit 302a and a 302b in FIG. 3.

The bias voltage circuits 302a and 302b are respectively connected to gate control terminals 304a, 306a and 304b, 306b of the first transistors MP1a, MP1b, MN1a and MN1b as shown in FIG. 3. In the first mode, the output voltage VL2 provided by the output of the differential amplifier 210 controls the current flow in the first transistors MP1a, MP1b, MN1a and MN1b. The gate control terminals 304a, 306a, 304b and 306b of the first transistors MP1a, MP1b, MN1a and MN1b are driven by the bias voltage circuits 302 in the first mode to conduct a first mirror current (IL2 in FIG. 2) according to the voltage bias signal VB. In addition, the gate control terminals of the first transistors MP1a, MP1b, MN1a and MN1b are individually connected to a second set of transistors MP2a, MP2b, MN2a and MN2b, respectively, as shown in FIG. 3. The first mirror current flowing in the first transistors establishes a second current flow IOUT2=IL2*G in the second transistors. The magnitude of the current flow IOUT2 through the second set of transistors MP2a, MP2b, MN2a and MN2b is set according to the gain value G representing the size ratio between the first and second sets of transistors. In the illustrated example, the gain value G is greater than 1. In one example, the transistors MP2a and MN2a form the first current source 222a to provide the feedforward current IOUT2 to the node 122a, and the transistors MP2b and MN2b form the current source 222b to provide the feedforward current IOUT2 to the node 122b in FIG. 2. The current gain G can be implemented by mirroring the output current of the class AB amplifier 210. This current mirror output stage gain G does not form any feedback loop of the amplifier 210 and hence the impedance looking into the transmit interface circuit 120 is determined primarily by the termination resistance RT, and is independent of the feedback circuits 204 of the first amplifier circuit 124.

As shown in FIG. 3, the mode control circuit 128 provides the control signal EN to selectively modify the gate control signals provided to the current mirror transistors. In one example, the first transistors MP1a, MP1b, MN1a and MN1b refrain from conducting current when the control signal EN is in a second state indicating the second operating mode M2. In one possible implementation, the mode control circuit 128 operates a set of pull-up or pull down transistors in order to pull the PMOS gate control lines 304a and 304b high (e.g., at or near VDD) to turn off the PMOS transistors MP1a, MP1b, MP2a and MP2b, and to pull the NMOS gate control lines 306a and 306b low (e.g., at or near the ground potential) to turn off the NMOS transistors MN1a, MN1b, MN2a and MN2b in the second mode M2. This turns off the current mirror circuit to cause the second amplifier circuit 126 to refrain from providing the feedforward current output signal IOUT2 to the output of the first amplifier circuit 124 in the second mode M2.

In this manner, the first amplifier circuit 124 drives the 100/1000Base-T signals in the second mode M2. The first amplifier circuit 124 is a class AB amplifier in certain examples to optimize power efficiency. In the second mode M2, the output swing is 2V peak differential for 100/1000Base-T operation. In the first mode M1, the control signal EN enables the second amplifier circuit 126 to generate the additional current IOUT2 using the unity gain feedback and a load resistor RL2 for 10BaseTe (Energy efficient mode) operation to achieve a 1.8V peak differential signal across the load RL. The additional current drive IOUT2 at the first amplifier output does not form any feedback loop, and hence does not affect the impedance. In the second mode M2, the first amplifier circuit 124 operates by negative feedback as a voltage mode driver. For 10Base-T operation in the first mode, the second amplifier circuit 126 provides additional current IOUT2 to generate higher voltage output swing based on the output voltage of the first amplifier circuit 124 and the current gain value G.

Assuming the resistors 214a and 214b are equal to the second feedback resistors 216a and 216b, and assuming that the resistor 220 is much smaller (e.g., R2=RF2 >>RL2), the output voltage Vo across the load 230 (RL) can be written as Vo=(Vo1(RL/(RL+RT))(((G*RT)/RL2)+1). In this case, Vo1=IDAC*RF1, and IDAC is the current input to the first amplifier circuit 124 from the DAC 118 in FIG. 2. A higher output voltage swing can be generated by increasing the gain value G. Additional filtering can be added in the second amplifier circuit 126 if signal shaping is desired. Moreover, since the current sources 222 are connected at the first amplifier outputs at nodes 122, the transmit interface circuit 120 will have enough headroom with a 1.8V differential output voltage peak swing while operating from a 2.5V supply VDD. The disclosed examples achieve the advantages of a voltage mode driver, while supporting various Ethernet operating modes and the transformer center tap voltage is defined by the output common mode of the first amplifier circuit 124.

The disclosed example transmit interface circuits 120 do not need any digital wave-shaping and the DAC noise/harmonics can be filtered by analog filtering using the feedback circuits 204 of the first amplifier circuit 124. These examples provide low power driver apparatus and interface ICs supporting voltage and filtering requirements of all three Ethernet modes including 10/100/1000Base-T. Moreover, the described circuits 120 can be operated from a low voltage supply, such as VDD=2.5V, whereas conventional voltage mode drivers is supplied with 3.3 or 3.6 V or higher to support 10Base-T mode. The disclosed examples can achieve low power consumption, such as 50% lower power compared to class B current mode drivers. The feedforward current assist (FCA) provided by the second amplifier circuit 126 facilitates voltage mode driver advantages along with low voltage operation. In addition, the IC examples 106 and the interface circuit 114 can be easily reprogrammed to change operating mode using the mode control circuit 128.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims. In addition, although a particular feature of the disclosure may have been disclosed with respect to only one of multiple implementations, such feature may be combined with one or more other features of other embodiments as may be desired and advantageous for any given or particular application.

What is claimed is:

1. A physical layer (PHY) network interface integrated circuit (IC) to interface a host system with a network, comprising:
    a transceiver circuit to receive outgoing data from a media independent interface of the host system, and to send transmit data to the network according to the outgoing data, the transceiver circuit comprising a transmit interface circuit, the transmit interface circuit including:
    a first amplifier circuit including a first amplifier having a first amplifier input to receive a first amplifier input signal representing the transmit data, and a first amplifier output to provide a first amplifier output signal at least partially according to the first amplifier input signal, and
    a second amplifier circuit including a second amplifier having a second amplifier input coupled with the first amplifier output to receive the first amplifier output signal, and a second amplifier output circuit coupled with the first amplifier output, the second amplifier output circuit operative in a first mode to selectively provide a feedforward current output signal to the first amplifier output at least partially according to the first amplifier output signal to increase a voltage swing at the first amplifier output, the feedforward current signal increasing output of the first amplifier above its operating voltage, the second amplifier output circuit operative in a second mode to refrain from providing the feedforward current output signal to the first amplifier output.

2. The PHY network interface IC of claim 1, wherein the first amplifier output provides the first amplifier output signal as a voltage signal at least partially according to the first amplifier input signal.

3. The PHY network interface IC of claim 1, wherein the first amplifier circuit comprises:
    a differential amplifier, including:
    a first input and a second input to receive a differential first amplifier input signal, and
    a first output and a second output to provide the first amplifier output signal as a differential voltage; and
    a second feedback circuit coupled between the second input and the second output of the differential amplifier.

4. The PHY network interface IC of claim 3, wherein the second amplifier output circuit is operative in the first mode to selectively provide the feedforward current output signal independent of the first and second feedback circuits of the first amplifier circuit.

5. The PHY network interface IC of claim 4, wherein the second amplifier circuit comprises:
    the second amplifier with a second amplifier output coupled to provide a second signal to a load resistor at least partially according to the first amplifier output signal, and
    a feedback circuit coupled between the second amplifier output and the second amplifier input to set a amplifier gain of the second amplifier; and
    wherein the second amplifier output circuit comprises a current mirror circuit operative in the first mode to provide the feedforward current output signal to the first amplifier output according to the second signal and a feedforward gain value.

6. The PHY network interface IC of claim 5, wherein the feedforward gain value is greater than 1.

7. The PHY network interface IC of claim 5, wherein the second amplifier gain value is unity.

8. The PHY network interface IC of claim 5, further comprising a mode control circuit to provide a control signal to set the mode of the transceiver circuit to the first mode or the second mode, wherein the second amplifier circuit is operative in response to the control signal setting the mode of the transceiver circuit to the second mode to disable the current mirror circuit to prevent the second amplifier output circuit from providing the feedforward current output signal to the first amplifier output.

9. The PHY network interface IC of claim 5, wherein the second amplifier provides a second current signal to generate a second voltage signal across a load resistor at least partially according to the first amplifier output signal.

10. The PHY network interface IC of claim 4, wherein a gain value of the second amplifier circuit is unity.

11. The PHY network interface IC of claim 1, wherein the first amplifier circuit comprises a feedback circuit coupled between the first amplifier input and the first amplifier output; and wherein the second amplifier output circuit is operative in the first mode to selectively provide the feedforward current output signal independent of the feedback circuit of the first amplifier circuit.

12. The PHY network interface IC of claim 11, wherein the second amplifier circuit comprises:

a second amplifier with a second amplifier output coupled to provide a second signal to a load resistor at least partially according to the first amplifier output signal, and a feedback circuit coupled between the second amplifier output and the second amplifier input to set a amplifier gain of the second amplifier; and wherein the second amplifier output circuit comprises a current mirror circuit operative in the first mode to provide the feedforward current output signal to the first amplifier output according to the third signal and a feedforward gain value.

13. The PHY network interface IC of claim 1, wherein the second amplifier circuit comprises:

a second amplifier with a second amplifier output coupled to provide a second signal to a load resistor at least partially according to the first amplifier output signal, and a feedback circuit coupled between the second amplifier output and the second amplifier input to set a amplifier gain of the second amplifier; and wherein the second amplifier output circuit comprises a current mirror circuit operative in the first mode to provide the feedforward current output signal to the first amplifier output according to the second signal and a feedforward gain value.

14. The PHY network interface IC of claim 13, wherein the second amplifier provides a second current signal to generate a second voltage signal across a load resistor at least partially according to the first amplifier output signal.

15. The PHY network interface IC of claim 1, wherein the second amplifier is a class AB amplifier.

16. A transmit interface circuit, comprising:

a first amplifier circuit with a first input to receive a data input signal, and a first amplifier output to generate a first amplifier output voltage signal according to the data input signal;

a first feedback circuit coupled between the first amplifier input and the first amplifier output to set a first amplifier gain of the first amplifier circuit;

a transconductance amplifier including a transconductance amplifier input coupled with the first amplifier output to receive the first amplifier output signal, and a transconductance amplifier output to provide a current output signal according to the first amplifier output voltage signal;

a load resistor coupled to the transconductance amplifier output to provide a load voltage signal according to the current output signal;

a second feedback circuit coupled between the transconductance amplifier output and the transconductance amplifier input to set a gain of the transconductance amplifier;

a current mirror circuit, including:

a first transistor operative when a control signal is in a first state to conduct a first mirror current according to the load voltage signal, the first transistor operative when the control signal is in a different second state to refrain from conducting current; and a second transistor coupled with the first amplifier output and with the first transistor, the second transistor operative when the control signal is in the first state to selectively generate a feedforward current output signal according to current flow in the first transistor and a feed forward gain value, and to provide the feedforward current output signal to the first amplifier output to selectively boost a voltage at the first amplifier output above a supply voltage of the transmit interface circuit according to the data input signal.

17. The transmit interface circuit of claim 16, wherein the first amplifier circuit, the transconductance amplifier and the current mirror circuit are differential circuits, wherein the data input signal is a differential signal; and wherein the first amplifier output voltage signal is a differential signal to drive a transformer primary winding.

18. The transmit interface circuit of claim 16, wherein the current mirror circuit generates a feedforward current output signal independent of the first feedback circuit when the control signal is in the first state.

19. The transmit interface circuit of claim 16, wherein the feedforward gain value is greater than 1.

20. The transmit interface circuit of claim 16, wherein the transconductance amplifier gain is unity.

21. An Ethernet network interface circuit for transmitting data to an Ethernet network through a magnetic interface, the network interface circuit comprising:

a voltage mode driver circuit with an output to generate a voltage signal from a supply voltage according to a data input signal; and a feedforward amplifier circuit with an output stage to generate a current signal from the supply voltage according to the voltage signal and to provide the current signal to the output to selectively boost the voltage signal at the output above the supply voltage.

22. The Ethernet network interface circuit of claim 21, wherein the output stage includes a current mirror circuit to generate the current signal according to a feedforward amplifier output signal generated by a transconductance amplifier of the feedforward circuit.

23. The Ethernet network interface circuit of claim 21, wherein the output stage is configured to generate the current signal according to the voltage signal and a feedforward gain, and wherein the feedforward gain is greater than unity.

* * * * *